(12) United States Patent
Kerber et al.

(10) Patent No.: US 6,239,478 B1
(45) Date of Patent: May 29, 2001

(54) SEMICONDUCTOR STRUCTURE FOR A MOS TRANSISTOR

(75) Inventors: Martin Kerber, München; Udo Schwalke, Heldenstein, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/095,263

(22) Filed: Jun. 10, 1998

Related U.S. Application Data

(62) Division of application No. 08/870,121, filed on Jun. 3, 1997, now Pat. No. 5,817,570.

(30) Foreign Application Priority Data

Jun. 3, 1996 (DE) .............................. 196 22 276

(51) Int. Cl.[7] .................................. H01L 23/58
(52) U.S. Cl. ................... 257/647; 257/213; 257/214; 257/215; 257/752; 257/753; 257/754; 257/755; 257/756; 438/587; 438/702; 438/911
(58) Field of Search ............................ 257/647, 213, 257/214, 215, 752, 754, 755, 756; 438/587, 702, 911

(56) References Cited

U.S. PATENT DOCUMENTS

| | | | |
|---|---|---|---|
| 4,051,273 | * 9/1977 | Abbas et al. | ............ 427/86 |
| 4,179,793 | * 12/1979 | Hagiwara | ............ 29/578 |
| 4,574,468 | 3/1986 | Slotboom et al. . | |
| 5,376,578 | 12/1994 | Hsu et al. . | |
| 5,606,202 | * 2/1997 | Bronner et al. | ............ 257/752 |
| 5,847,433 | * 12/1998 | Kerber | ............ 257/369 |

FOREIGN PATENT DOCUMENTS 41 12 045 A1   10/1991 (DE) .

OTHER PUBLICATIONS

"Improved Narrow Trench Profile Using a Composite Spacer Process" (Garling et al.), Motorolla, Aug. 1996, p. 143.

* cited by examiner

*Primary Examiner*—Eddie C. Lee
*Assistant Examiner*—Matthew E. Warren
(74) *Attorney, Agent, or Firm*—Herbert L. Lerner; Laurence A. Greenberg; Werner H. Stemer

(57) ABSTRACT

The MOS transistor has field plates and a subarea of the gate formed from the same polysilicon layer. A gate oxide lying underneath them is produced at the beginning of the fabrication process and it therefore exhibits particularly high quality. The polysilicon in the active area is raised to the same level as the adjoining field oxide areas, resulting in a planar topology.

1 Claim, 3 Drawing Sheets

SEMICONDUCTOR STRUCTURE FOR A MOS TRANSISTOR

CROSS-REFERENCE TO RELATED APPLICATION

This application is a division of application No. 08/870,121, filed Jun. 3, 1997, now U.S. Pat. No. 5,817,570.

BACKGROUND OF THE INVENTION

FIELD OF THE INVENTION

The invention relates to a semiconductor structure for an MOS transistor with a substrate, a gate oxide and a polysilicon layer lying above it. Furthermore, the invention relates to a method for fabricating such a semiconductor structure.

Integrated MOS circuits, and in particular CMOS circuits, are fabricated with various methods in which the well dopants are generally introduced and implanted by temperature treatment. Then, isolation areas are produced by local oxidation of silicon (LOCOS) or shallow trench isolation (STI). After the isolation areas have been produced, a gate oxide is grown on the active areas by thermal oxidation and covered with a gate electrode which is preferably composed of polysilicon. The polysilicon is structured with a resist mask and reactive ion etching (RIE). The etching must thereby be sufficiently selective with respect to the gate oxide underneath, so that the substrate is not attacked during the etching. The production of the integrated circuit is then continued in a known manner.

Two significant problems, amongst others, arise during the fabrication of such integrated MOS transistors, and in particular of CMOS transistors. One problem relates to the quality of the gate oxide and the other to the topology during the structuring of the gate electrode. The quality of the gate oxide is essentially characterized by the defect density and the breakdown field strength. As the number of process steps involved in the production of the gate oxide increases, the quality of the gate oxide becomes worse, since each preceding process step increases the defect density and the surface becomes increasingly uneven. Therefore, it is desirable to produce the gate oxide as early as possible, i.e., during one of the first process steps, and to cover it with a gate electrode.

When the insulation of integrated CMOS circuits is produced by means of the local oxidation technique (LOCOS), for example, there is always a topology step at the junction between the active region and the insulation area. That topology step is of the order of magnitude of the thickness of the gate electrode, and is thus in the range of approximately 0.5 $\mu$m. As a result of different resist thicknesses and reflections at the field oxide edge, this has a disadvantageous effect on the dimensional accuracy during the structuring of the gate electrode. Furthermore, a spacer is formed at the field oxide step, so that the gate electrode is significantly thicker at this point than in the other areas. The greater thickness at this point must be allowed for by means of a longer etching time. However, on the other hand the etching must not continue through the extremely thin gate oxide and into the substrate. For a given level of the topology step at the field oxide edge this results in a very high etching selectivity and/or a correspondingly thick gate oxide.

SUMMARY OF THE INVENTION

It is accordingly an object of the invention to provide a semiconductor structure for a MOS transistor, in particular a CMOS transistor, and a method for fabricating the semiconductor structure, which overcomes the above-mentioned disadvantages of the heretofore-known devices and methods of this general type and which structure has a particularly good gate oxide quality and a largely regular topology in order to avoid the overetching problem with the gate electrode at the field oxide edge.

With the foregoing and other objects in view there is provided, in accordance with the invention, a semiconductor structure for a MOS transistor, comprising:

a substrate, a gate oxide on the substrate, and a polysilicon layer on the gate oxide;

the polysilicon layer having interruptions formed therein, and defining field plates and a polysilicon layer in an active area of the semiconductor structure;

insulating oxide disposed above the field plates and in the interruptions in the polysilicon layer;

and a further polysilicon deposition on the polysilicon layer in the active area, the deposition raising up the polysilicon layer in the active area to a level being substantially coplanar with the insulating oxide above the field plates.

In other words, the polysilicon layer has interruptions and forms field plates and a polysilicon layer in the active area. An insulating oxide is provided above the field plates and in the interruptions in the polysilicon layer. The polysilicon layer is raised in the active area, with the further polysilicon deposition, to such an extent that the polysilicon forms a plane with the insulating oxide above the field plates in the active area.

The foregoing semiconductor structure is preferably produced, in accordance with the invention, by a method which comprises the following step:
a) producing a gate oxide and a polysilicon layer on a substrate;
b) depositing a dielectric on the polysilicon layer;
c) structuring the dielectric and forming active areas;
d) fabricating spacers at edges produced during the structuring step;
e) partially oxidizing the polysilicon layer between the spacers;
f) removing the spacers, and removing the polysilicon of the polysilicon layer underneath the spacers isotropically;
g) conformally depositing an oxide;
h) spacer-etching of the oxide deposited in step g), and also removing, in the active area, oxide produced in step e); and
i) depositing silicon in the active area to a level of an adjoining oxide structure.

In other words, a gate oxide and a polysilicon layer are produced on a substrate, a dielectric is deposited on the polysilicon layer, the dielectric is structured in order to form active areas, a spacer is fabricated at edges produced during the structuring, the polysilicon layer is partially oxidized between these spacers, the spacers are removed, the polysilicon of the polysilicon layer under the spacers is removed anisotropically, an oxide is deposited in a conformal way, spacer etching which, in the active area, also removes the oxide produced previously, is carried out on the deposited oxide, and silicon is deposited in the active area to the level of the adjoining oxide structure.

Accordingly, a semiconductor structure for a MOS transistor and in particular a CMOS transistor with field plate isolation is created. In the process, a first oxide is used as gate oxide and the first polysilicon layer which is deposited thereon is simultaneously used as part of the gate electrode and as field plate layer outside the active areas. The gate oxide and the first polysilicon layer are produced at the start of the process sequence, as a result of which an optimum gate oxide quality is achieved. The gate areas are separated from the isolation areas in a self-aligned fashion by means of microtrench etching. These trenches are filled in by means of a spacer. A further polysilicon layer is selectively deposited on the exposed, first polysilicon areas, the thickness of which is selected to be such that the thickness of the resulting gate electrode is approximately equal to the thickness of the first polysilicon layer and of the field oxide layer. This results in a surface with minimum topology, which offers an optimum precondition for structuring the gate electrode. In addition, when the gate electrode is etched, the thickness of polysilicon in the active areas is constant everywhere so that overetching can be minimized, resulting in higher process reliability.

In a preferred development of the method according to the invention, the gate oxide is produced by thermal oxidation. Thermal oxidation of a planar, unstructured semiconductor surface at the start of the method permits a thin gate oxide with a high level of quality to be produced, since the semiconductor surface has a low defect density and is particularly planar at the start of the process.

The polysilicon layer lying above the gate oxide layer is preferably produced with a thickness of 50 to 300 nm. Generally, it is desirable to keep the layer as thin as possible. However, on the other hand, it is necessary to ensure that the field plates are sufficiently thick.

Preferably CVD oxide is deposited as dielectric on the polysilicon layer. In a further embodiment, this CVD oxide is structured using a photographic technique and anisotropic etching. In this way, selective structuring with respect to the polysilicon layer underneath is possible and the polysilicon can be exposed in the active areas.

Subsequently produced spacers are preferably fabricated from nitride to a width of 50 to 100 nm. The nitride spacer acts as an oxidation barrier and can be selectively processed in a particularly satisfactory way during the remaining process.

In accordance with an additional feature of the invention, a LOCOS method is preferably used to oxidize the polysilicon layer.

Finally, in accordance with a concomitant feature of the invention, a conductive layer is subsequently deposited and structured in order to produce a gate. The conductive layer is preferably a silicide.

Other features which are considered as characteristic for the invention are set forth in the appended claims.

Although the invention is illustrated and described herein as embodied in a semiconductor structure for a MOS transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
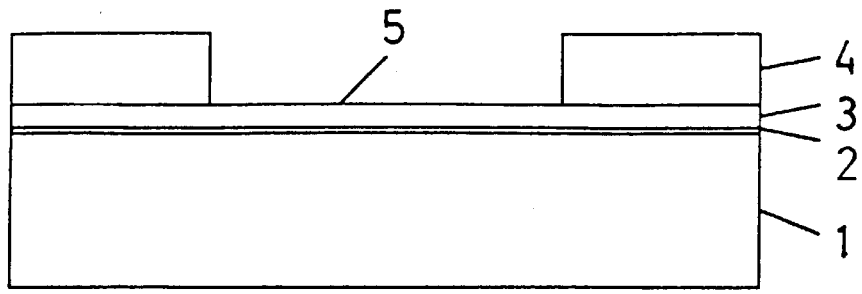
FIGS. 1 to 7 are diagrammatic sections through a MOS transistor, illustrating a process sequence according to the invention.

Referring now to the figures of the drawing in detail and first, particularly, to FIG. 1 thereof, there is seen a gate oxide 2 produced on a planar, unstructured semiconductor surface 1. The gate oxide 2 is produced by thermal oxidation or by a similar method, and it is covered with a polysilicon layer 3 of approximately 50 to 300 nm in thickness. A CVD oxide 4 or another dielectric, which is provided to form the field oxide areas, is deposited thereon. Using a photographic technique and anisotropic etching, the CVD oxide 4 is selectively structured with respect to the polysilicon layer 3 underneath, so that an active area 5 with the polysilicon exposed in this area is produced. This is the extent of the illustration in FIG. 1 of the MOS transistor during its fabrication.

Figure 2:
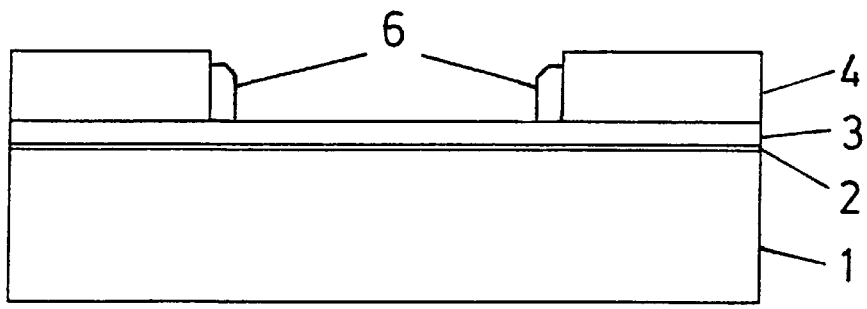
Figure 3:
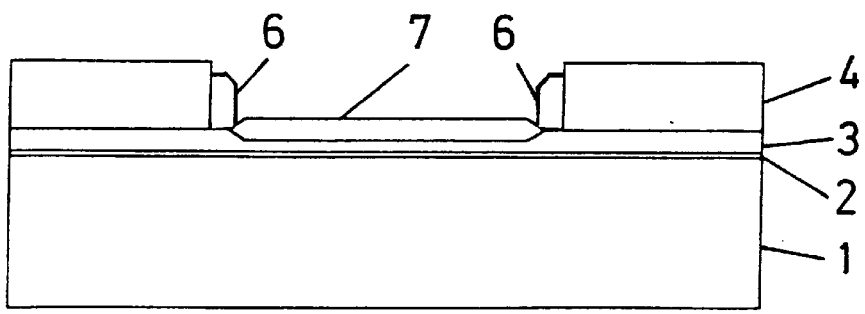

The next step is illustrated in FIG. 2. A spacer 6 is fabricated on the vertical field oxide edge for the purpose of producing microtrenches. The vertical edge on the field oxide is obtained by anisotropic etching of the CVD oxide 4. The spacer 6 is composed of nitride and is approximately 50 to 100 nm wide and it acts as an oxidation barrier in the following steps. FIG. 3 illustrates how the polysilicon layer 3 exposed in the active area 5 is partially oxidized. The resulting oxide layer 7 ends at the boundary to the spacer 6, so that polysilicon is still present underneath the spacer 6. At this point, it is also important that the oxidation does not take place through the entire polysilicon layer 3, but that a thin layer of polysilicon remains underneath the oxide layer 7.

Figure 4:
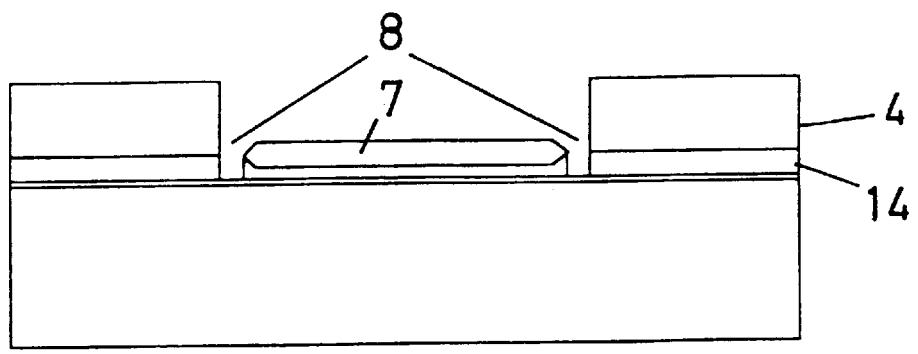

In the next step, the nitride spacers 6 are then removed isotropically and the polysilicon of the polysilicon layer 3 lying underneath is removed anisotropically down to the gate oxide 2 underneath. The etching takes place selectively with respect to the oxide so that the oxide layer 7 in the active area acts as a mask and only isolation trenches 8 are produced where the spacers 6 were previously located. This stage in the process is illustrated in FIG. 4.

Figure 5:
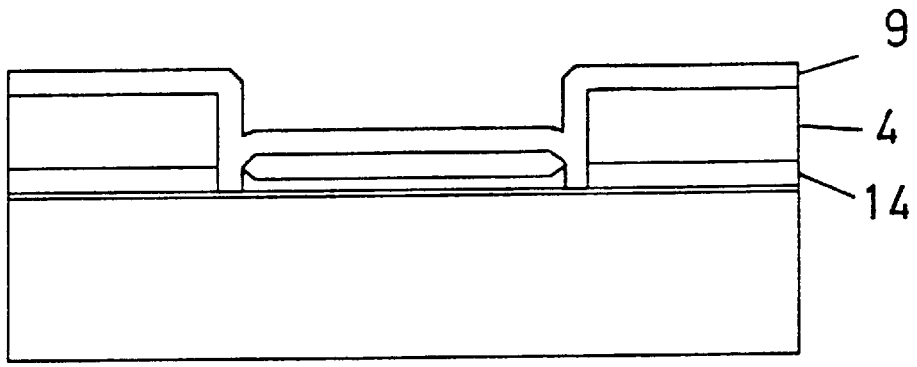
Figure 6:
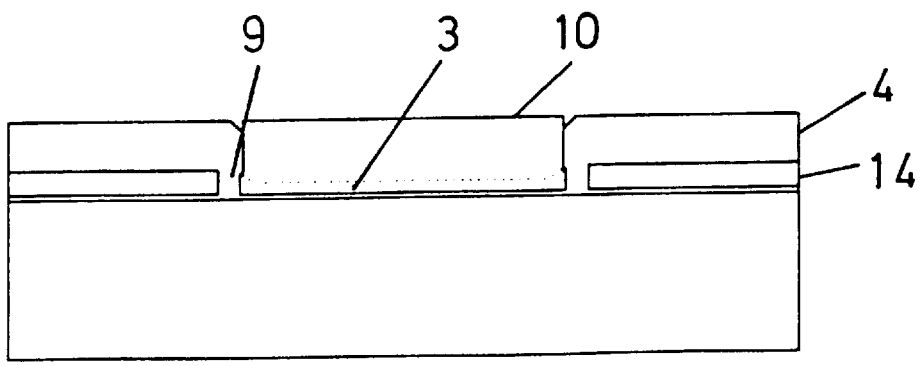
Figure 7:
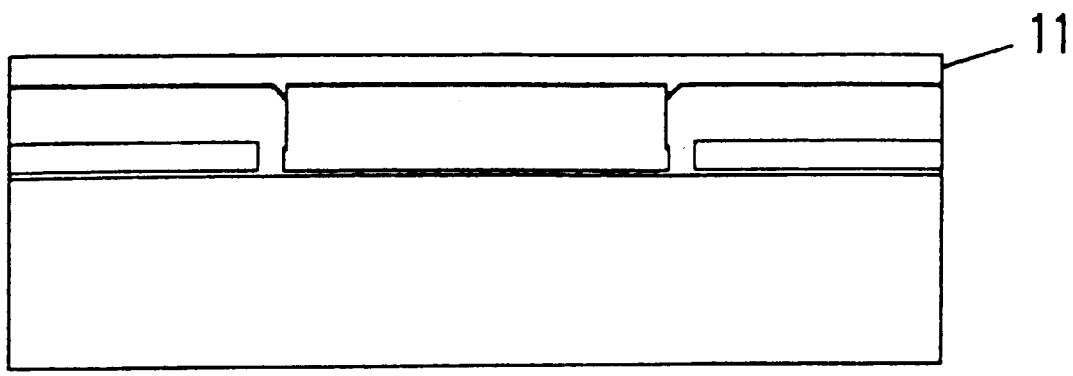

Referring now to FIG. 5, the isolation trenches 8 (insulation trenches 8) are filled during the next step with a conformal deposition of oxide 9. The entire structure is covered with an oxide layer 9. In the next step, the spacer is etched in that both the oxide layer 9 and the oxide layer 7 underneath it are removed in the active area 5. In the field oxide areas, the oxide layer 9 lying at the top and a layer of the CVD oxide lying underneath it are removed again to the same extent as in the active area 5. The active area is raised to the level of the field oxide areas by selective deposition of silicon 10. This stage in the process is illustrated in FIG. 6.

The first polysilicon layer 3 serves at the same time to form the left and right field plates 14 and to cover, at an early point, the gate oxide 2 lying underneath it, and forms a subarea of the gate polysilicon. The electric insulation between the field plates and the gate polysilicon of the same polysilicon layer 3 is produced by means of microtrenches 8 so that the gate areas are completely separated from the areas of the field plate polysilicon.

Figure 8:
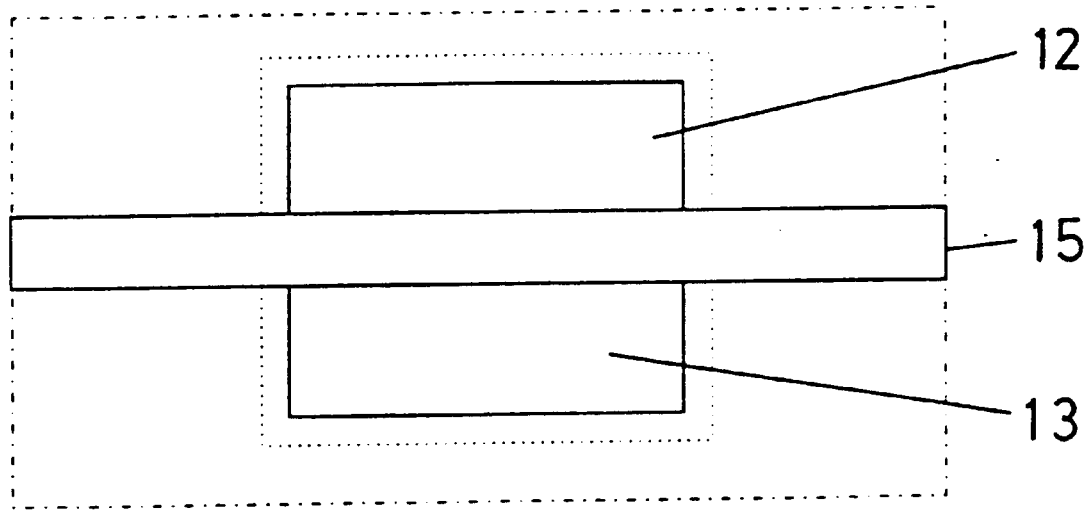
FIG. 8 is a plan view of a MOS transistor.

The semiconductor structure which is fabricated in this way is developed further by depositing a conductive layer 11, preferably composed of a silicide, over the entire surface. The local connections between the individual polysilicon areas is produced from this conductive layer 11. Furthermore, the structuring of the gate areas and the local wiring of the gate areas are effected in the conductive layer 11 using a second photographic technique. The polysilicon 10 is etched outside the gate areas in a customary way. These areas are seen in FIG. 8 at numerals 12 and 13. During the etching treatment, the layer is now of the same thickness everywhere so that the overetch step can be reduced to a minimum. This gives rise to greater processing latitude while using the same etch technique, and it is further possible to provide a thinner gate oxide.

FIG. 8 shows a plan view of a MOS transistor with a source 12, a drain 13 and a gate 15. After the structuring of the gate, the fabrication process takes place in a customary way with drain doping and metallization.

The MOS transistors can be doped in various stages by means of implantation, either before the production of the gate oxide, after the application of the first polysilicon layer and before the application of the field oxide, or after the structuring of the gate. During operation, the potential of the field plates must be approximately equal to the potential of the wells located underneath them. To this end, the field plate areas must be placed in electrical contact with the associated wells at least at one point. This can preferably be carried out by means of misaligned well contacts whose contact surfaces make contact partially with the field plates and partially with the associated wells.

We claim:

1. A semiconductor structure for a MOS transistor having a source, a drain and a channel, comprising:

a substrate, a gate oxide on said substrate, and a polysilicon layer on said gate oxide;

said polysilicon layer having interruptions formed therein, and defining field plates and a polysilicon layer in an active area of the semiconductor structure;

insulating oxide disposed above said field plates and in said interruptions in said polysilicon layer; and a further polysilicon deposition on said polysilicon layer in the active area, said deposition raising up said polysilicon layer in the active area to a level being substantially coplanar with said insulating oxide above said field plates.

* * * * *